United States Patent
Reyal et al.

(10) Patent No.: US 7,075,402 B1
(45) Date of Patent: Jul. 11, 2006

(54) METHOD FOR TREATING A BRITTLE THIN METAL STRIP AND MAGNETIC PARTS MADE FROM A NANOCRYSTALLINE ALLOY STRIP

(75) Inventors: Jean-Pierre Reyal, Eragny (FR); Francis Schmit, Ansaco (FR)

(73) Assignee: Imphy Ugine Precision, Puteaux (FR)

( * ) Notice: Subject to any disclaimer, the term of this patent is extended or adjusted under 35 U.S.C. 154(b) by 0 days.

(21) Appl. No.: 09/889,626

(22) PCT Filed: Jan. 14, 2000

(86) PCT No.: PCT/FR00/00077

§ 371 (c)(1),
(2), (4) Date: Sep. 28, 2001

(87) PCT Pub. No.: WO00/43556

PCT Pub. Date: Jul. 27, 2000

(30) Foreign Application Priority Data

Jan. 19, 1999 (FR) .................................. 99 00521

(51) Int. Cl.
*H01F 27/24* (2006.01)
(52) U.S. Cl. ....................................................... 336/234
(58) Field of Classification Search ................ 336/234; 29/602.1, 609; 427/384–386; 428/611, 428/655, 675
See application file for complete search history.

(56) References Cited

U.S. PATENT DOCUMENTS

| 3,189,483 A | 6/1965 | Trigg et al. |
| 4,096,815 A | 6/1978 | Faulkner |
| 4,558,297 A | 12/1985 | Shigeta et al. |
| 4,749,625 A | 6/1988 | Obayashi et al. |
| 5,198,040 A | 3/1993 | Sawa et al. |
| 6,794,860 B1 * | 9/2004 | Schafer .................. 324/117 H |

FOREIGN PATENT DOCUMENTS

| DE | 35 03 019 A1 | 7/1986 |
| EP | 687 134 A2 | 12/1995 |
| EP | 0687134 A2 * | 12/1995 |
| EP | 695 812 A1 | 2/1996 |
| EP | 0695812 A1 * | 7/1996 |
| WO | WO 91/12960 A1 | 9/1991 |

* cited by examiner

*Primary Examiner*—Tuyen T Nguyen
(74) *Attorney, Agent, or Firm*—Sughrue Mion, PLLC

(57) ABSTRACT

The invention concerns a treatment method which consists in coating at least one surface of a brittle thin metal strip (1) with a coating film (3, 3') comprising at least a polymer material, to obtain on the strip an adhering coat with a thickness ranging between 1 and 100 µm, modifying the working and breaking properties of the brittle thin metal strip (1); then carrying out a step wherein the brittle thin metal strip (1) is subjected to stresses, such as a cutting operation, on the brittle thin metal strip (1) coated with the film coating (3, 3'). The method is particularly useful for producing magnetic parts from strips or ribbons with nanocrystalline structure.

22 Claims, 5 Drawing Sheets

METHOD FOR TREATING A BRITTLE THIN METAL STRIP AND MAGNETIC PARTS MADE FROM A NANOCRYSTALLINE ALLOY STRIP

The invention relates to a process for the treatment of a thin brittle metal strip and products obtained from the treatment of the strip, which may comprise forming operations such as a cutting operation. In particular, it relates to a process for obtaining components for magnetic use by cutting them from a metal strip having a nanocrystalline structure.

It has been proposed to manufacture thin strip of a magnetic alloy, and in particular an alloy having a high permeability, which has a structure mainly consisting of very fine grains in an amorphous matrix, the size of which grains may, for example, be between 1 and 100 nm. Such alloys are called nanocrystalline alloys.

Nanocrystalline metallic materials are obtained, in the form of thin strip, for example having a thickness of around 20 μm, from amorphous strip or ribbon produced by casting and rapidly cooling a liquid metal on a cooled roll or between two cooled rolls. The amorphous strip or ribbon is heat treated by holding it at a temperature of around 550° C. for a time of around one hour so that it develops a nanocrystalline structure within a substantial part, for example more than 50%, of its volume.

This heat treatment may be preceded by prior heat treatments at lower temperatures, for example of around 200° C.

When magnetically soft iron-based alloys are cast, cooled and then heat treated, it is possible to obtain, from the strip in the nanocrystalline state, products such as magnetic circuit cores exhibiting excellent magnetic properties which cannot be generally obtained in the case of materials whose structure is different from a nanocrystalline structure.

However, a drawback of strip or ribbon having a nanocrystalline structure is that such strip or ribbon is very brittle so that the slightest mechanical stress results in the strip or ribbon fracturing. It is not even possible to handle the strip or ribbon having a nanocrystalline structure without taking very great precautions, because stresses, even very low stresses induced in the strip result in its undergoing brittle fracture. The only process known at the present time for manufacturing metal components such as magnetic cores from strip having a nanocrystalline structure consists in winding the strip of magnetic alloy in the amorphous state and then heat-treating this strip at a temperature at which the nanocrystalline structure develops. Optionally, the heat treatment may be carried out in a magnetic field in order to modify the hysteresis loop of these nanocrystalline alloys.

It is therefore not possible at the present time to manufacture nanocrystalline magnetic components by mechanical treatment or machining operations including, for example cutting.

It would be of very great interest to obtain magnetic components from strip made of a nanocrystalline magnetic alloy which have a profile whose geometrical shape is well defined. In particular, it would be extremely beneficial to be able to manufacture, from nanocrystalline strip, magnetic components having the shape of washers, U-or E-shapes or even components having complex shapes used for making clocks or watches.

More generally, it may be extremely beneficial to have a process allowing the treatment of a thin brittle metal strip, having a small thickness, generally less than 0.1 mm, the treatment of the strip involving at least one step in which the brittle strip is subjected to stresses, especially cutting or bending stresses.

In EP-0 687 134, it has been proposed to produce a miniaturized transformer comprising a laminated magenetic core consisting of a plurality of thin strips linked together by layers of resin. The laminate is cut to the dimensions of the core to be obtained.

U.S. Pat. No. 4,558,247 describes a saturable core comprising a wound strip made of amorphous magnetic allot and an insulating film inserted between the successive turns of the core.

It is therefore an object of the invention to provide a process for the treatment of at least one thin brittle metal strip having a thickness of less than 0.1 mm, comprising at least one step in which the thin strip is subjected to stresses, this process making it possible to avoid the risks of the brittle strip fracturing during its treatment and, in particular, to obtain components of precise and/or complex geometrical shape from the thin brittle strip.

For this purpose, prior to the step of the process in which the thin strip is subjected to stresses, at least one side of the strip is covered with a coating layer made of at least one polymer material so as to obtain, on the strip, an adhesive layer having a thickness of between 1 and 100 μm, modifying the deformation and fracture properties of the thin metal strip, and the step of the process in which the thin strip is subjected to stresses is carried out on the strip covered with the coating layer.

In order to make the invention clearly understood, the implementation of a process according to the invention, for the production of magnetic components by cutting them from a strip made of a nanocrystalline magnetic alloy will now be described, by way of example, with reference to the figures appended hereto.

Figure 1:
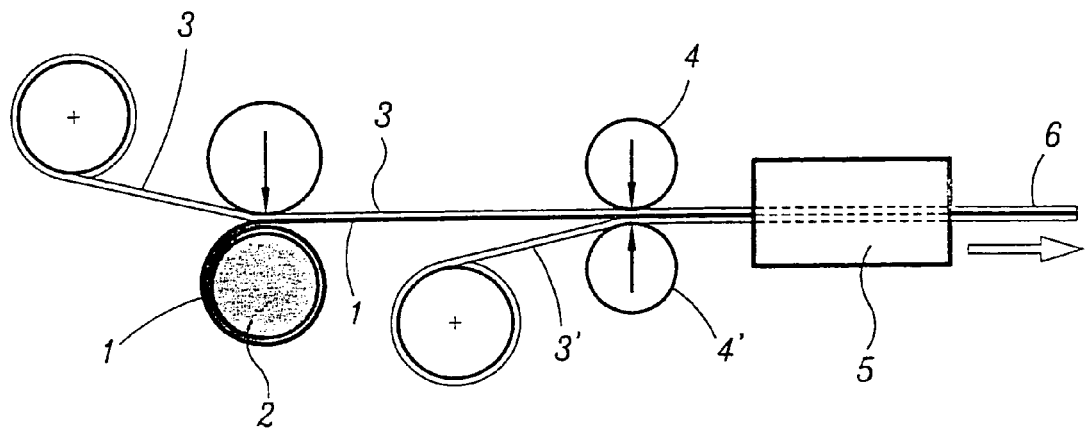
FIG. 1 is a schematic side view of a plant for implementing the process according to the invention and according to a first embodiment.

The process according to the invention as will be described below is used for the manufacture of flat magnetic components made of a magnetic material in a nanocrystalline form.

The magnetic material is a soft magnetic material, generally consisting of an alloy containing mainly iron or, optionally, a mixture of iron and a ferromagnetic metal such as nickel and cobalt, together with copper, silicon, boron and a metal such as niobium.

The magnetic material may also contain iron, zirconium and boron and optionally copper and silicon.

The magnetic alloys to which the invention applies are therefore, for example, Fe—Cu—Nb—B—Si or Fe—Zr—(Cu)—B—(Si) alloys (the brackets around the symbols Cu and Si indicating that these elements may possibly be absent).

Of course, the invention may apply to other magnetic alloys.

By way of example, an iron-based alloy was produced which had the following atomic composition:

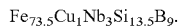

$Fe_{73.5}Cu_1Nb_3Si_{13.5}B_9$.

The numbers given as subscripts for the elements of the alloy correspond to the atomic percentages of these elements in the alloy.

The iron alloy in the liquid state is cast on an efficiently cooled roll made of a good heat conductor, so as to obtain strips or ribbons in the amorphous state with a thickness of around 20 μm and a width of greater than 5 mm.

The strips or ribbons in the amorphous state are then subjected to an annealing heat treatment at a temperature close to 550° C. for a time of about one hour in order to obtain a structure composed of fine crystals, or nanocrystalline structure, within a significant volume fraction of the strip, for example a structure consisting, by volume, of at least 50% of grains having a size smaller than 100 nm.

The treatment according to the invention is used to obtain, by cutting the strip, shaped magnetic components, while preventing the metal strip from fracturing during cutting. The treatment process according to the invention is generally carried out on the strip in the nanocrystalline state. In certain cases, the treatment according to the invention may be carried out on a strip in the amorphous state, a subsequent heat treatment allowing the nanocrystalline structure to develop.

The strip, wound in the amorphous state, may be introduced into a heat treatment furnace so as to obtain a nanocrystalline strip wound on a mandrel after the heat treatment. This heat treatment may be carried out in a magnetic field.

The treatment according to the invention consists firstly in covering one side of the strip made of a nanocrystalline alloy with a coating layer comprising a polymer. The strip covered on one of its sides with a layer of material containing a polymer may be handled without any risk of fracture. The strip can then be covered on its second side with a layer of material containing a polymer and the two layers covering the strip are made to adhere to the faces of the strip by applying pressure and/or by a heat treatment.

It is then possible to superpose and join together, for example by adhesive bonding, pressure or heat treatment, several metal strips covered on one or both sides with a layer containing a polymer, so as to obtain laminated composite parts comprising several superposed metal layers separated by layers containing a polymer material.

The treatment according to the invention includes an additional operation, for example an operation of machining or forming the metal strip coated on both its sides or the laminated composite strip, in order to obtain shaped components, for example by cutting the strip.

As may be seen in FIG. 1, in a first method of implementing the treatment process according to the invention, a nanocrystalline strip 1 is covered on the first side and then on the second side with an adhesive material consisting of a plastic film precoated with adhesive.

The strip 1 of nanocrystalline alloy is wound onto a mandrel 2 having a radius of curvature sufficient to prevent deformation or excessive stressing of the strip 1. The winding onto the mandrel 2 is carried out on the cast and cooled strip in the amorphous state, which is then heat treated at about 550° C. in the wound state on the mandrel.

Firstly, a strip 3 made of a polymer material precoated with adhesive is bonded to one side of the strip 1 unwound from the mandrel 2. The strip 3 of polymer material precoated with adhesive is unwound from a reel and then applied and pressed against the strip 1 of nanocrystalline alloy by a press roll in an arrangement opposite the reel consisting of the strip 1 of nanocrystalline alloy wound on the mandrel 2. In this way, the strip 3 is brought into contact with the upper side of the strip 1 of nanocrystalline alloy, and made to adhere thereto, at the exact point where the strip 1 is unwound. In this way, any handling of a length of strip 1 not covered with a layer of plastic precoated with adhesive is avoided.

The strip 1 of nanocrystalline alloy covered on its upper side with the strip 3 made of polymer material is brought into contact, on its lower side, with a second strip 3' made of a polymer material precoated with adhesive wound in the form of a reel. Two opposed press rolls 4 and 4' are used to exert pressure on the strip 1 covered with the strips 3 and 3' made of polymer material. The pressure exerted by the press rolls 4 and 4' makes it possible to achieve good adhesion of the strips 3 and 31 to the faces of the strip 1 made of nanocrystalline alloy.

It is possible, so as to further improve the adhesion of the strips 3 and 3' to the faces of the strip made of nanocrystalline alloy 1, to make the laminated strip consisting of the strip 1 covered with the layers 3 and 3' pass through a heat treatment unit within which the adhesive material of the strips 3 and 3' is crosslinked, thereby improving the quality of the bonding.

On leaving the heat treatment unit 5, the strip 1, fastened to the covering layers 3 and 3', constitutes a laminated strip 6, the deformation and fracture behavior of which is fundamentally different from the behavior of the strip 1 made of nanocrystalline alloy which is essentially brittle. The laminated strip 6 no longer exhibits brittle behavior and its fracture modes are radically different from the brittle fracture modes of the strip 1. Consequently, the strip 6 obtained after the first phase of the treatment process according to the invention may be subjected to a shear stress like that employed in a process for mechanical cutting of the strip. In this way it is possible to obtain, by cutting the strip 6, shaped components without any risk of fracturing the strip 1 made of nanocrystalline alloy which is fastened by its two faces to the covering strips 3 and 3' made of polymer material.

To obtain magnetic components having satisfactory properties, it is necessary for the strips with a nanocrystalline structure to have low internal stresses, these stresses being at a level as low as possible. This result can be achieved by carrying out the heat treatment of amorphous strips on a mandrel or a core having a large radius of curvature, as described above, or by using a furnace for heat treating the nonwound strip in a stress-free state, for example in a furnace for treating the strip laid flat on a support. The operations carried out on the nanocrystalline strip covered with two adherent layers of polymer create practically no stresses in the nanocrystalline strip, even if these operations entail large external stresses, such as sheer stresses.

The films 3 and 3' of polymer material precoated with adhesive, which are used to cover both sides of the strip 1, may consist of a film of a polymer material such as a polyester, a polytetrafluoroethylene (PTFE) or a polyimide, the film being combined with a layer of self-adhering material allowing the film to be bonded to the strip. Certain self-adhering materials may be crosslinked within a heat treatment unit like the unit 5 shown in FIG. 1.

Next, starting from laminated strips 6 each comprising a nanocrystalline strip covered on both its sides with strips made of polymer material, it is possible to manufacture a laminated composite comprising several superposed laminated strips 6 made to adhere to one another by pressure and/or by heat treatment. In particular, such composites may be obtained from laminated strips 6 consisting of the nanocrystalline strip 1 covered on both its sides or on just one side with double-sided polymer strips, that is to say strips having self-adhering layers on both their sides.

Since the laminated or composite strips obtained no longer carry any risk of brittle fracture when cutting components, it is possible to produce, from these laminated or composite strips, any magnetic component, for example with the shape of a U or the shape of an E, or any magnetic component of complex shape used in watchmaking, as will be explained below.

The layers of polymer material used to cover the nanocrystalline strip are chosen so as to avoid degrading the magnetic properties of the nanocrystalline strips by the stresses induced during adhesion of the polymer strip to the nanocrystalline strip or during the operation of crosslinking the polymers in contact with the nanocrystalline strip. In general, measures will be taken to avoid subjecting the strip to a high tensile or compressive stress during the adhesion phase or the crosslinking phase.

However, in certain cases it is possible to adjust the magnetic properties of the laminate or composite consisting of one or more nanocrystalline strips by using the magnetostriction properties of the nanocrystalline strip or strips and by applying certain stresses to the nanocrystalline strips via the polymer-based layers.

In certain applications, for example in the case of components intended for the manufacture of energy conversion systems, the magnetic components obtained by the process of the invention must be able to withstand a relatively high temperature, for example a temperature of 150° C. In this case, of course, the polymers forming the covering layers of the nanocrystalline strip, which remain fastened to the magnetic components obtained after cutting, must withstand the operating temperature of the magnetic components.

Instead of self-adhering covering strips made of a polymer material precoated with adhesive, it is possible to use as the layer for covering the nanocrystalline strips, a thermoplastic polymer film which does not become adhesive until a heat treatment. Such a thermoplastic film is called "non-tacky" because its thermoplastic part is not adhesive at room temperature.

Figure 2:
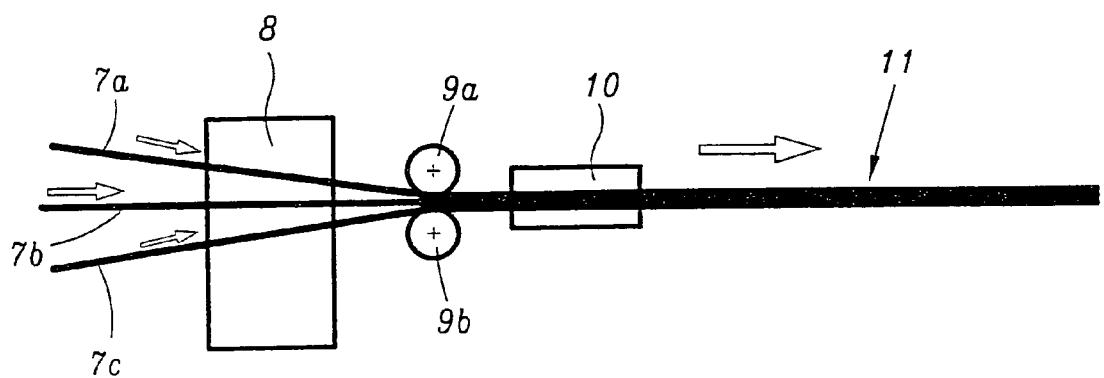
FIG. 2 is a schematic side view of a plant for implementing the process according to the invention and according to a second embodiment.

FIG. 2 shows one phase of a treatment according to the invention during which is produced a cuttable composite consisting of nanocrystalline strips and covering layers made of a polymer material which are bonded together by a thermoplastic material after a heat treatment.

As previously, strips made of nanocrystalline alloy are used, these generally being wound in the form of reels and obtained by treatment of a reel of alloy in the amorphous state. Each of the strips of nanocrystalline alloy used for the manufacture of the composite is covered, on its upper side and on its lower side, with a thermoplastic polymer film precoated with adhesive. Thus, a plurality, for example three, of laminated strips 7a, 7b, 7c are produced, each comprising a strip made of nanocrystalline alloy placed between two polymer films. The strips 7a, 7b and 7c are made to run through a heating chamber 8 at a temperature of less than 400° C., which raises the temperature of the thermoplastic films of the layers for covering the laminated strips 7a, 7b, 7c to above the melting point of the thermoplastic film and above the contact bonding temperature. The bonding of the strips 7a, 7b and 7c is carried out between two press rolls 9a and 9b. After cooling in a cooling chamber 10, a composite strip 11 is obtained which can be cut into the form of shaped magnetic components.

The thermoplastic films allowing adhesion of the covering layers may consist of one of the following polymers: modified polyethylene (modified by acrylic acid, maleic anhydride or other materials), grafted polypropylene, polyamide, polyurethane.

The properties of the laminated composite 11 obtained by the process using the second method of implementation allow cutting without any fracture and without any undesirable stresses being produced in the strips of nanocrystalline material.

Instead of self-adhering or thermoplastic covering strips, it is possible to produce laminates or composites according to the invention by a process of coating the faces of one or more nanocrystalline strips with adhesive. A non-tacky reactive adhesive material with a thickness of between 1 and 50 microns is then used.

An adhesive is called a reactive or two-stage adhesive when it is possible to carry out on this adhesive two successive polymerization or crosslinking reactions. Such a material is called a non-tacky material because it does not adhere after the first crosslinking reaction.

This adhesive may be chosen from thermosetting or thermoplastic polymers, depending on the desired magnetic properties of the magnetic component to be produced from the laminate or composite. These magnetic properties may in fact depend on the thermal conditions imposed on the laminate or composite during its manufacture.

Figure 3:
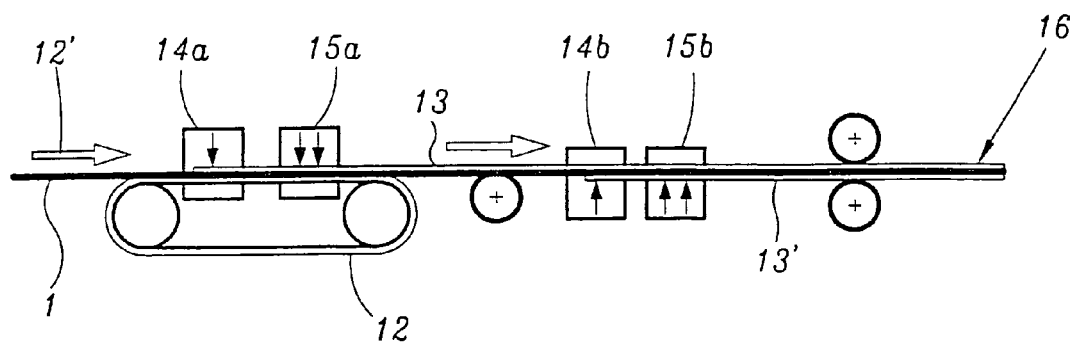
FIGS. 3 and 4 are side views of plants for implementing two successive phases of a treatment process according to the invention and according to a third embodiment.

FIG. 3 shows schematically a plant for manufacturing a laminated material comprising a nanocrystalline strip by a process of coating the faces of the nanocrystalline strip directly with adhesive using a reactive adhesive.

The nanocrystalline strip 1, which preferably comes from a reel, is deposited on a support band 12, preferably made in the form of a flexible band movable in the direction indicated by the arrow 12'. Located above the movable support band 12 are a first coating unit 14a and a first drying and crosslinking unit 15a, through which units the strip 1 of nanocrystalline alloy supported by the support band 12 is moved in the direction of the arrow 12'. A coating layer 13 is deposited on the upper side of the nanocrystalline strip 1 inside the first coating unit 14a. This coating layer 13 is dried and crosslinked in the first drying and crosslinking unit 15a.

The strip 1 of nanocrystalline alloy, coated with the layer 13 of plastic which adheres to its upper side, may be handled without any risk of fracture. It is therefore possible to make the strip 1 coated with the coating layer 13 pass from the support band 12 to a second coating unit 14b for depositing, on the second or lower side of the strip 1, a second coating layer 13' which is dried and crosslinked in a second drying and crosslinking unit 15b through which the strip coated on both its sides is made to run.

After leaving the plant shown in FIG. 3, a laminated strip 16 is obtained which comprises the nanocrystalline central strip 1 coated on both its sides with coating layers 13 and 13' made of a crosslinked polymer material.

The nanocrystalline strip, coated on both its sides with perfectly adhesive layers of plastic no longer exhibits brittle behavior and can be cut into the form of magnetic components of complex shapes.

Figure 4:
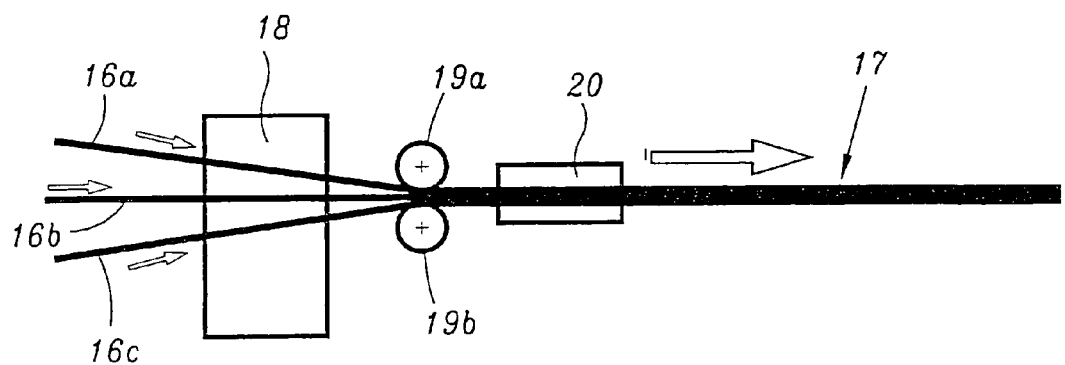

As may be seen in FIG. 4, it is also possible to combine several laminated strips 16a, 16b, 16c similar to the laminated strip 16 in order to obtain a composite strip by superposition and adhesion of the laminated strips 16a, 16b and 16c.

A laminated composite strip could also be obtained by stacking strips of nanocrystalline alloy covered only on one side.

The strips 16a, 16b and 16c may be made to pass through a heating chamber 18 for raising them to a temperature of less than 400° C. The heated strips 16a, 16b and 16c are then pressed between two press rolls 19a and 19b, thereby allowing the strips 16a, 16b and 16c which include thermoplastic polymers to be bonded to one another. The composite strip 17 obtained is cooled in a cooling unit 20.

In a subsequent step of the treatment process according to the invention, magnetic components may be cut from the composite strip 17 without the nanocrystalline strips constituting the composite 17 fracturing.

The first step, consisting in producing the laminate 16 by depositing polymer layers on one or both sides of a nanocrystalline strip, may be carried out not only by coating, as indicated above, but also by spraying a polymer covering substance on one side of the strip, or each side of the strip in succession. The covering substance is then polymerized. It would also be possible to coat both sides of the nanocrystalline strip in a single step by dipping. However, it would then be more tricky to handle the nanocrystalline strips.

To carry out the process according to the invention with direct adhesive coating of the nanocrystalline strip, it is possible to use a polymer of one of the following types: acrylic material, polyester, epoxy resin, phenolic epoxy resin, polyester/epoxy resin, phenolic resin with modifier, polyurethane/polyester resin. The covering layer made of polymer material may have a thickness of 1 to 50 μm.

In all the cases envisaged above, a laminated or composite strip comprising one or more nanocrystalline strips is obtained, each nanocrystalline strip being covered on one or both of its sides with a polymer layer. Consequently, it is possible to cut magnetic components from the laminated or composite strips without any risk of the nanocrystalline strips fracturing.

If it is desired to manufacture magnetic components of the toric type with a narrow hysteresis loop, that is to say the $B_r/B_s$ ratio of which is very much less than 1, the components will be cut out so as to create fracture interfaces in the cut composite components. These fracture interfaces may be produced by stamping, at the time of cutting.

The treatment process according to the invention which includes a step of producing a layer covering the nanocrystalline strips may be combined with the previous process for producing nanocrystalline strips from amorphous strips.

Figure 5:
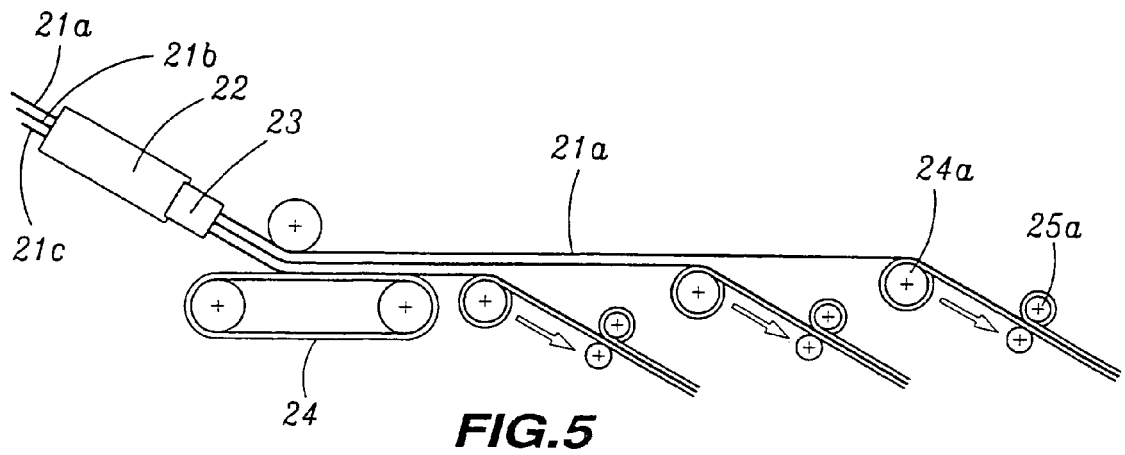
FIG. 5 is a side view of a plant for implementing the process according to the invention and according to a fourth embodiment.

FIG. 5 shows a plant for carrying out the first step, of covering with a layer of polymer material, of the treatment according to the invention on nanocrystalline strips leaving the heat treatment furnace for developing nanocrystalline structures in strips of amorphous alloy.

FIG. 5 shows a heat treatment furnace 22 in an inclined arrangement which may consist, for example, of a quartz tube surrounded by electrical heating means and an inductor allowing, optionally, the strip to be subjected to a magnetic field. Several amorphous strips, for example three strips of amorphous alloy 21a, 21b and 21c, are made to pass through the furnace 22. The amorphous strips 21a, 21b and 21c are subjected to a heat treatment at a temperature of about 550° C. inside the furnace 22 for a time sufficient to develop a nanocrystalline structure in these strips. The strips 21a, 21b and 21c are cooled in a cooling unit 23 and then deposited on a movable support band 24. The strips are then covered, on one or both sides, with self-adhering polymer strips precoated with adhesive which are wound in the form of reels, such as 24a and 25a placed in the path of each of the strips such as the strip 21a.

On leaving the plant, three laminated strips are obtained, each consisting of a strip of nanocrystalline alloy covered on one or both of its faces with adherent strips of polymer material.

The laminated strips obtained may be cut in the form of magnetic components or assembled by bonding in order to form composite strips comprising several superposed laminated strips which may themselves be cut.

Figure 6A:
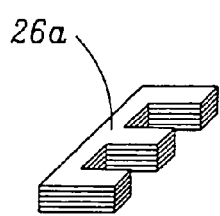
FIGS. 6A, 6B and 6C are perspective views of transformer components obtained by a process according to the invention comprising a step of cutting a nanocrystalline thin magnetic strip.
Figure 6B:
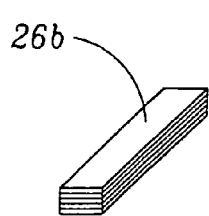
Figure 6C:
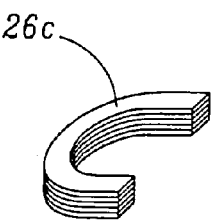

FIGS. 6A, 6B and 6C show examples of components produced by cutting strips made of a laminated composite which are formed by the superposition and consolidation of laminated strips each consisting of a nanocrystalline strip covered with one or two layers of polymer material which adhere to the faces of the nanocrystalline strip. The laminated composite may consist of a plurality of superposed laminated strips linked together, this number of superposed strips possibly being, for example, equal to three or more.

For example, in the case of nanocrystalline strips having a thickness of 20 μm and covered on both their sides with layers of a polymer material having a thickness of 5 μm, a stack of three superposed laminated strips has a thickness of 80 μm, i.e. 0.08 mm.

Of course, it is possible to produce magnetic components by cutting thicker laminated composite strips, for example having a thickness of 1 mm or more.

From such a laminated composite is possible to produce transformer components in the shape of an E, an I or a U, as may be seen in FIGS. 6A, 6B and 6C respectively, showing an E-shaped transformer component 26a, an I-shaped transformer component 26b and a U-shaped component 26c, respectively.

Such transformer components exhibit very good magnetic properties because they consist of layers of a nanocrystalline alloy having very good mechanical properties and because the sheets of nanocrystalline alloy are protected by adherent layers of plastic over their entire surface. Furthermore, as indicated above, there is an extremely reduced risk of the nanocrystalline strips fracturing during cutting of the laminated composite products.

The components as shown in FIGS. 6A, 6B and 6C may be cut by any method of mechanically cutting shaped components, for example by stamping with a blanking die.

The laminated structure of the components obtained is also favorable for limiting the eddy current losses in these components when they are used as transformer components.

It is also possible to use components cut from laminated composites, according to the process of the invention, which can be used as toric cores.

Figure 7A:
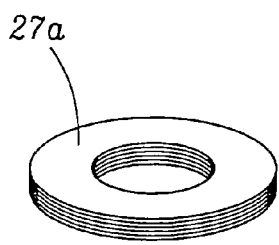
FIGS. 7A, 7B and 7C are perspective views of toric magnetic cores obtained by a treatment process according to the invention comprising a cutting step.
Figure 7B:
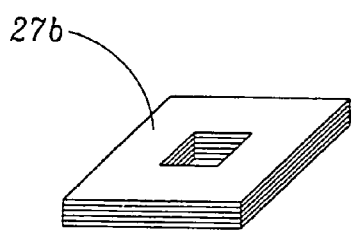

As may be seen in FIGS. 7A and 7B, tori may be produced with the shape of cut washers 27a as shown in FIG. 7A, or the shape of frames 27b with a square or rectangular cross section, hollowed out at their center, as shown in FIG. 7B.

Figure 7C:
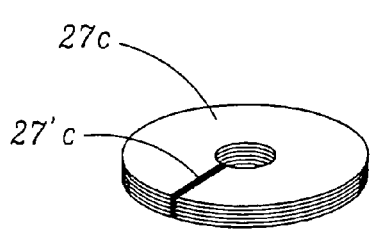

It is also possible, as shown in FIG. 7C to produce tori with a gap having the shape of laminated washers 27c with a radial slit 27'c constituting a gap. Both the cutting of the washers 27c and the formation of the slot 27'c can be carried out without any risk of fracturing the nanocrystalline strips constituting the laminated composite product. Cut tori are thus obtained which may be of very small dimensions.

In general, the components obtained, such as those shown in FIGS. 6A to 6C and 7A to 7C, may be components with small or very small dimensions and which also have a flat and very thin shape.

It is also possible to produce, using the process of the invention, components for miniaturized magnetic circuits, for example for producing rotors or stators of watches.

It is also possible to produce components for rotors or stators of motors, in particular very small electric motors.

The process according to the invention can also be used to produce anti-theft labels made of a high-permeability material, the presence of which on an article or object can be detected when the object passes through a loop of a circuit through which a current flows. Passage of the object carrying the anti-theft article is then detected by the variation in the current induced in the loop.

Figure 8:
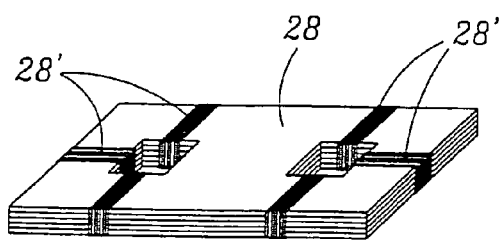
FIG. 8 is perspective view of a component of an electrical circuit obtained by a process for the treatment according to the invention of thin nanocrystalline strips.

As may be seen in FIG. 8, it is also possible to produce, using the process according to the invention, thin inductors or transformers 28, having a thickness which may, for example, be of the order of one millimeter, allowing these thin inductors or transformers to be mounted on a surface of a device.

A laminated composite strip comprising superposed laminated layers, each consisting of a nanocrystalline strip surrounded by layers of polymer material, is, for example, cut in the form of rectangles 28 in which holes, for example of square cross section, are made. The primary and secondary parts of a transformer may be produced by winding electrical wires 28' onto the component obtained.

In all the examples described above of how to implement the invention, the magnetic components are cut from the laminated strips or laminated composites by a mechanical process.

As shown in FIGS. 9A to 9C and 10, it is also possible to produce magnetic components of complex shape from thin strips of nanocrystalline alloy by a chemical cutting process.

Figure 9A:
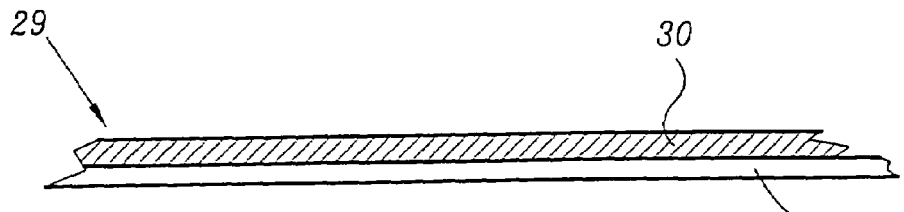
FIGS. 9A, 9B and 9C are schematic views showing three successive phases in the implementation of a treatment process according to the invention comprising a chemical cutting step.

As shown in FIG. 9A, a laminate 29 is firstly produced from a strip 30 of nanocrystalline alloy which is coated on one of its sides with a strip 31 of polymer material, the bonding of the latter to the strip 30 being provided by a process as described above.

Figure 9B:
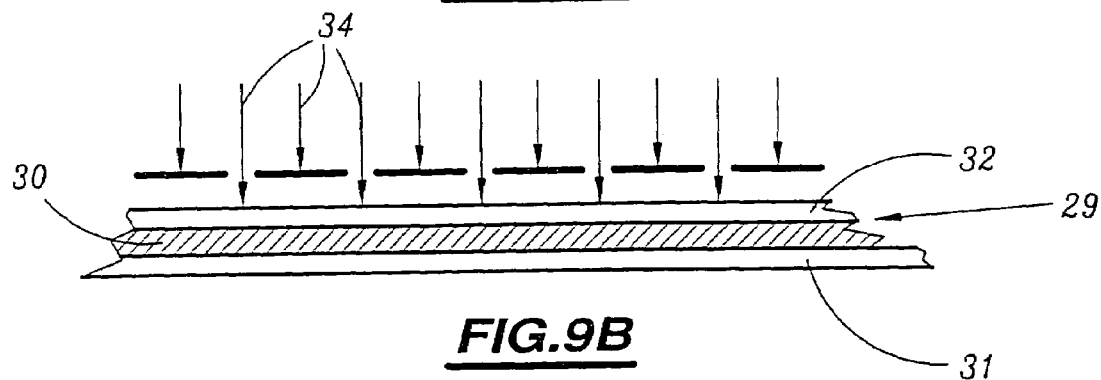

As shown in FIG. 9B, the laminated strip 29 is then covered with a layer 32 of a photosensitive resin and the layer 32 of photosensitive resin deposited on the external surface of the strip of nanocrystalline alloy of the laminate 29 is exposed to light rays 34 through a screen 33 of suitable shape.

Figure 9C:
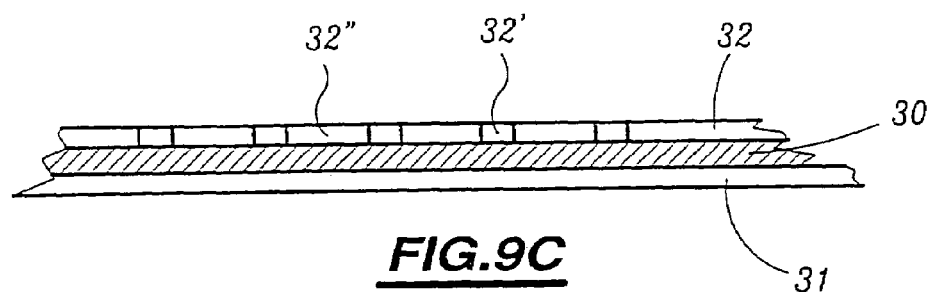

As may be seen in FIG. 9C, the next step is to remove the layer 32 of photosensitive resin, partially exposed, either the exposed parts 32' or the parts 32" masked by the screen 33 and therefore not exposed, using a suitable solvent. For example, the solvent used may be water if the photosensitive layer consists of modified casein.

By applying a technique similar to etching, using an etchant such as an acid or ferric chloride, the components are cut along the unexposed parts of the layer 32.

Figure 10:
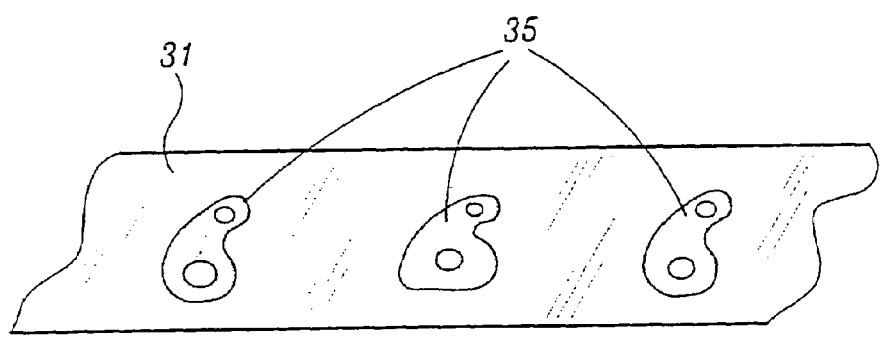
FIG. 10 is a top view showing a number of components obtained by a process according to the invention involving chemical cutting.

As shown in FIG. 10, magnetic components 35 bonded to the polymer support strip 31 of the laminated material 29 are obtained. Thus, there is no risk of the components fracturing, these being protected and packaged on leaving the manufacturing line.

From the components thus obtained, it is possible, as shown in FIGS. 11A to 11E, to manufacture a transformer integrated into a printed circuit or a discrete transformer by a process according to the invention.

Figure 11A:
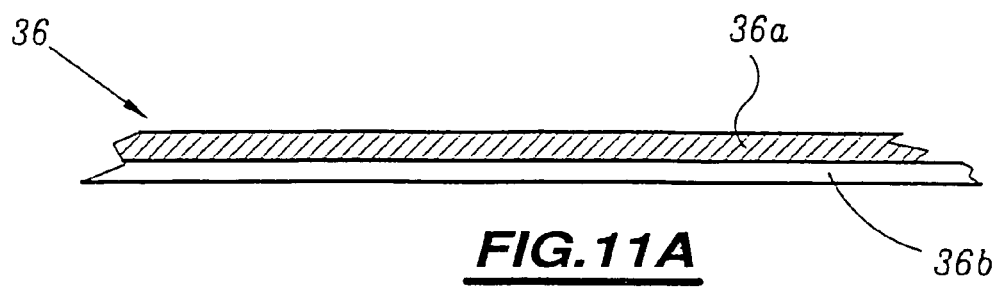
FIGS. 11A, 11B, 11C, 11D and 11E are schematic views showing the successive phases in the implementation of the process of the invention and the manufacture of a transformer integrated or not integrated into a printed circuit.
Figure 11B:
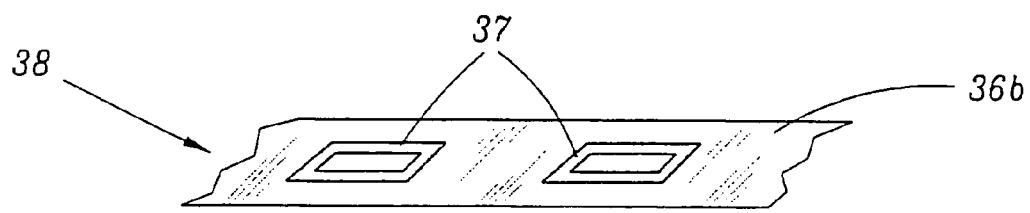
Figure 11C:
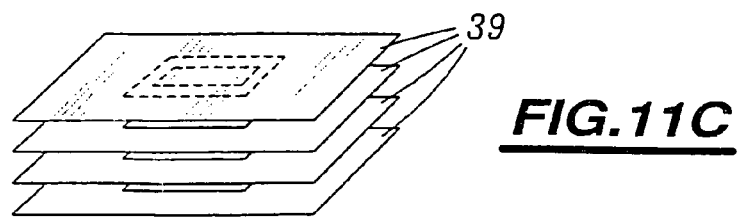
Figure 11D:
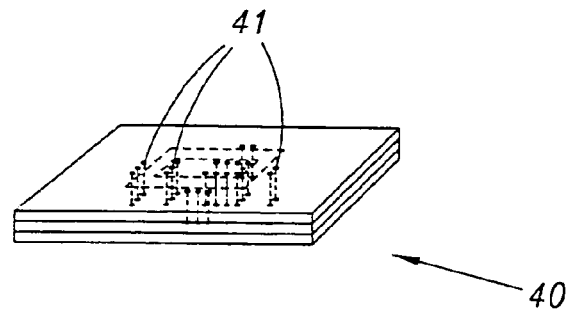
Figure 11E:
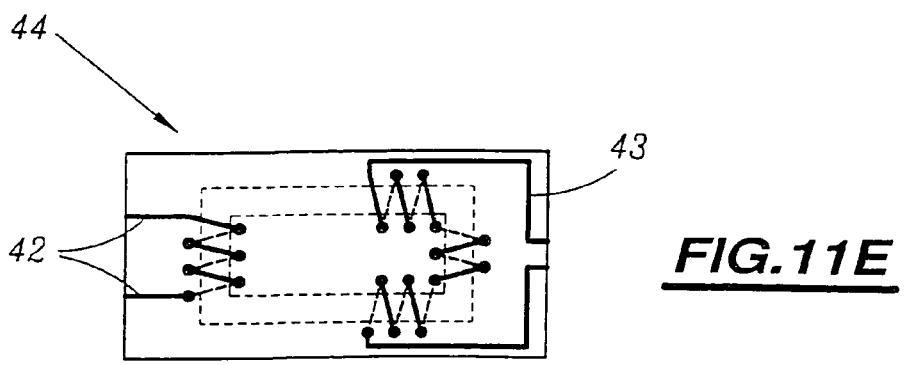

In a first step, a laminate 36 (FIG. 11A) consisting of a strip 36a of nanocrystalline alloy and a film 36b of polymer material adhering to one side of the strip 36a is produced. For example, using the process described above with regard to FIGS. 9A, 9B, 9C and 10, a product 38 comprising the plastic film 36b as substrate and thin successive magnetic circuits 37 made of nanocrystalline alloy, for example in the form of rectangular frames, adhering to the substrate is produced (FIG. 11B).

The product 38 is cut into portions, each comprising a thin magnetic circuit 37 fastened to a substrate portion. The cut portions 39 (FIG. 11C) are stacked on one another so that the magnetic circuits 37 are precisely superposed and separated by the plastic substrate layers 36b. The superposed layers 36b are adhesively bonded to one another, for example by applying heat and pressure, in order to obtain a composite laminated product 40 (FIG. 1D). The superposed plastic films 36b are drilled, as shown in FIG. 1D, in regions located inside and outside the superposed magnetic circuits 37 in order to obtain a plurality of holes 41 passing through the composite laminate 40. The holes 41 are then internally metal-plated so as to create continuous conducting regions between the two faces of the composite laminate 40, at which faces the holes 41 emerge.

Next (FIG. 11E), electrical conductors such as 42 and 43 are produced, for example by chemical etching, on both faces of the composite laminate 40, said electrical conductors joining, on each face of the composite laminate 40, a first set of holes 41 and a second set of holes 41, respectively.

The conductors 42 and 43 and the plated-through holes 41 to which they are connected constitute the primary and secondary windings of the transformer 44, which can be used in a printed circuit.

Using this process, it would be also possible to produce other components, such as inductors intended to be inserted into a printed circuit or intercalated on a printed circuit and comprising at least one winding.

In the case of the methods of implementing the invention which have been described hitherto, it is one or both sides of strips made of nanocrystalline alloy, that is to say strips obtained after a heat treatment of an amorphous strip in order to obtain a nanocrystalline strip, that are covered.

It is also possible to apply the invention by depositing a covering layer containing a polymer on an amorphous strip which is then cut to the shape of magnetic components, these components then being heat treated in order to develop a nanocrystalline structure in the amorphous material of the components.

The various steps of such a process are the following:

1. one or both sides of an amorphous strip are coated with a complex solvent mixture which may consist of water, polymer binders, aluminates, silicates and fluxes;

2. the coating layer is dried so that the coating adheres to the amorphous strip;

3. several amorphous strips coated on both their sides or on just one side are superposed;

4. the inorganic cement undergoes a first firing in order to obtain a cuttable amorphous strip/inorganic cement composite;

5. the components are cut from the laminate thus formed; and 6. the cut components are heat treated at a temperature allowing nucleation of nanocrystals in the amorphous strip and vitrification of the polymer/aluminate/silicate/flux mixture.

Depending on the type of polymer/silicate/aluminate/flux mixture used, a temperature greater than 500° C. may be suitable.

The polymer is oxidized during the heat treatment.

To form the mixture for coating the amorphous strip, this mixture being in the pasty state, it is possible to use the following substances:

an ethylcellulose-type resin, which ensures the mechanical integrity of the coating and gives the viscosity suitable for the type of application;

solvents, for example a mixture of aliphatic or aromatic hydrocarbons which are intended to dissolve the resin and must be easily removed by treatment at low temperature, for example at 100° C.;

a mineral filler, for example glasses or oxides, this being intended to increase the adhesion of the layer to the material in the nanocrystalline state, after its treatment;

an organic filler, for example consisting of organometallic substances or surfactants, this being intended to improve the dispersion, the wetting and the corrosion resistance of the covering layer.

A typical example of the composition of the pasty coating substance is given below:
metal filler: 40 to 70 parts by volume;
resin: 3 to 10 parts by volume;
mineral filler: 3 to 6 parts by volume;
organic fillers; 0.5 to 2 parts by volume;
solvent: the balance of the composition up to 100 parts by volume.

The process according to the invention therefore makes it possible to obtain, in all cases, magnetic components consisting of thin strips of nanocrystalline alloy without any risk of the strip fracturing.

The process according to the invention allows magnetic components made of nanocrystalline alloy to be obtained in complex shapes, something which hitherto had not been possible, the only components made of nanocrystalline alloy that could be obtained being toric cores consisting of a wound strip.

It is also possible to obtain strips made of nanocrystalline alloy which are not brittle by covering one side of a ribbon of nanocrystalline alloy with a coating or a film containing at least one plastic.

Within the context of a treatment according to the invention, these strips may be handled and used in various ways, and for example slit in the form of strips having a width less than the width of the nanocrystalline strip cast in amorphous form and heat treated.

The process according to the invention makes it possible to avoid any risk of the thin strips of nanocrystalline alloy, or possibly amorphous alloy, from fracturing while the magnetic components are being formed, for example by cutting or drilling.

The invention, whose application is particularly beneficial in the case of nanocrystalline alloys may, however, be used in all cases in which it is necessary to handle or form thin brittle metal strips having a thickness of less than 0.1 mm.

Nor is the invention limited to the methods of implementation that have been described above.

Thus, it is possible to cover the thin brittle metal strip with a coating layer containing a polymer material in a manner different from those which have been described above.

Nor is the invention limited to the nature and to the composition of the layers produced on the thin metal strips during the first phase of the process according to the invention.

Nor is the invention limited to the case in which the strips are cut in a second step of the process, rather it applies to all cases in which thin brittle metal strips are handled or machined when this handling or machining subjects the brittle strips to stresses.

The invention can be applied in fields other than the manufacture of magnetic components.

The invention claimed is:

1. A process for the treatment of only a single thin brittle metal strip (1, 30) which is made of a soft magnetic alloy having a nanocrystalline structure, that is to say containing at least 50 vol % of fine crystals having a size of less than 100 nm, obtained by casting the soft magnetic alloy in the form of an amorphous strip and by heat treatment of the amorphous strip, and which has a thickness of less than 0.1 mm, comprising at least one step in which the thin strip (1, 21a, 21b, 21c, 30) is subjected to stresses, characterized in that, prior to the step of the process in which the thin strip (1, 21a, 21b, 21c, 30) is subjected to stresses, at least one side of the strip is covered with a coating layer (3, 3', 31) made of at least one polymer film so as to obtain, on the strip, an adhesive layer having a thickness of between 1 and 100 μm, modifying the deformation and fracture properties of the thin metal strip, and in that the step of the process in which the thin strip is subjected to stresses is carried out on the strip covered with the coating layer.

2. The process as claimed in claim 1, characterized in that the coating layer (3, 3') made of at least one polymer film consists of a self-adhering plastic film precoated with adhesive.

3. The process as claimed in claim 2, characterized in that the self-adhering plastic film precoated with adhesive comprises a layer of a pressure-sensitive self-adhering substance and in that the self-adhering coating layer (3, 3') is made to adhere to the thin metal strip (1) by pressing the coating layer (3, 3') onto the thin metal strip (1).

4. The process as claimed in claim 3, characterized in that the plastic film consists of one of the following materials: polyester, polytetrafluoroethylene, polyimide.

5. The process as claimed claim 3, characterized in that one side of the thin brittle metal strip (1) is brought into contact with a first self-adhering polymer film (3), the nanocrystalline strip (1) thus being able to be handled, in that the second side of the thin brittle metal strip (1) is brought into contact with a second film (3') made of a self-adhering plastic, in that pressure is applied to the laminated strip (6) consisting of the thin brittle metal strip (1) between the two films of polymer material (3, 3') and in that a cutting operation is carried out on the laminated strip (6).

6. The process as claimed in claim 3, characterized in that a plurality of laminated strips (6, 7a, 7b, 7c) each having a coating layer consisting of a plastic film precoated with a pressure-sensitive adhesive on at least one of its sides are produced, in that the plurality of laminated strips (6, 7a, 7b, 7c) are superposed and joined together by adhesion in order to obtain a laminated composite strip (11) and in that a cutting operation is carried out on the laminated composite strip (11).

7. A process for the treatment of at least one thin brittle metal strip (1, 21a, 21b, 30) having a thickness of less than 0.1 mm, comprising at least one step in which the thin strip (1, 21a, 21b, 21c, 30) is subjected to stresses, characterized in that,
prior to the step of the process in which the thin strip (1, 21a, 21b, 21c, 30) is subjected to stresses, at least one side of the strip is covered with a coating layer (3, 3', 13, 13', 31) made of at least one polymer film so as to obtain, on the strip, an adhesive layer having a thickness of between 1 and 100 μm, modifying the deformation and fracture properties of the thin metal strip, and in that the step of the process in which the thin strip is subjected to stresses is carried out on the strip covered with the coating layer,
the coating layer (3, 3') made of at least one polymer film consists of a self-adhering plastic film precoated with adhesive,
the self-adhering plastic film precoated with adhesive comprises a layer of a pressure-sensitive self-adhering substance and in that the self-adhering coating layer (3, 3') is made to adhere to the thin metal strip (1) by pressing the coating layer (3, 3') onto the thin metal strip (1),
the pressure-sensitive adhesive substance of the self-adhering plastic film precoated with adhesive is a crosslinkable substance, and
a crosslinking heat treatment is carried out on the coating layer adhering to the thin metal strip.

8. The process as claimed in claim 1, characterized in that the coating layer comprising at least one polymer film consists of a thermoplastic non-self-adhering polymer film precoated with adhesive on one of its faces, in that such a thermoplastic film precoated with adhesive is brought into contact with at least one of the sides of the thin metal strip (1) in order to obtain a laminated strip (7*a*, 7*b*, 7*c*), in that a plurality of laminated strips (7*a*, 7*b*, 7*c*) are manufactured in this way, in that the plurality of laminated strips (7*a*, 7*b*, 7*c*) are heated to a temperature of less than 400° C., in that the strips of the plurality of laminated strips (7*a*, 7*b*, 7*c*) heated to obtain a composite laminated strip (11) are superimposed and compressed one against another, and in that a process step involving stresses, such as a cutting operation, is carried out on the composite laminated strip (11).

9. The process as claimed in claim 8, characterized in that the thermoplastic film is made of one of the following polymer materials: polyethylene modified by acrylic acid or maleic anhydride; grafted polypropylene; polyamide; polyurethane.

10. The process as claimed in claim 1, characterized in that the coating layer comprising at least one polymer film consists of a reactive adhesive polymer material, in that the coating layer is deposited on at least one of the sides of the thin brittle metal strip (1), in order to obtain a laminated strip (16), in that a plurality of laminated strips (16*a*, 16*b*, 16*c*) is produced in this way, in that the laminated strips (16*a*, 16*b*, 16*c*) are heated to a temperature of less than 400° C., in that the laminated strips (16*a*, 16*b*, 16*c*) are superimposed in the heated state, in that pressure is exerted on the superimposed strips (16*a*, 16*b*, 16*c*) in order to achieve the adhesion of the laminated strips (16*a*, 16*b*, 16*c*), in order to obtain a laminated composite strip (17), and in that an operation involving mechanical stresses, such as a cutting operation, is carried out on the composite laminated strip (17).

11. The process as claimed in claim 10, characterized in that the reactive adhesive coating consists of one of the following polymer materials: acrylic material, polyester, epoxy resin, phenolic epoxy resin, polyester/epoxy resin, phenolic resin with modifier, polyurethane/polyester resin.

12. The process as claimed in claim 10, characterized in that the reactive adhesive polymer material is deposited on at least one side of the thin metal strip (1) by one of the following processes: coating, spraying, dipping.

13. The process as claimed in claim 1, characterized in that the thin brittle metal strip (1) is covered, in one of its amorphous or nanocrystalline states, on at least one side with a coating layer comprising at least one polymer film.

14. The process as claimed in claim 13, characterized in that the coating layer comprising a polymer material has a thickness of between 1 and 50 μm.

15. The process as claimed in claim 14, characterized in that the thin strip of nanocrystalline material has a thickness of around 20 μm.

16. The process as claimed in claim 13, characterized in that the soft magnetic material contains either a first combination of iron, copper, niobium, silicon and boron, or a second combination of iron, zirconium and boron.

17. The process as claimed in claim 16, characterized in that the atomic composition of the soft magnetic alloy is of the Fe—Cu—Nb—B—Si type or of the Fe—Zr—(Cu)—B—(Si) type.

18. The process as claimed in claim 1, characterized in that that step in which the thin strip (1) is subjected to stresses is a mechanical cutting operation.

19. The process as claimed in claim 1, employing a step of chemically cutting a thin metal strip (30) coated on one of its sides with a coating layer (31) made of polymer material.

20. The process as claimed in claim 1 for the production of a component (44) of a printed circuit, comprising at least one winding (42, 43), such as a transformer (44), characterized in that:

a laminated strip (36) consisting of a strip (36*a*) made of nanocrystalline alloy and of a film of polymer material (36*b*) adhering to one of the sides of the strip of nanocrystalline alloy is produced;

the strip made of nanocrystalline alloy is cut in order to obtain a plurality of magnetic circuits (37) made of nanocrystalline alloy each adhering to one section of the film of polymer material (36*b*);

a plurality of sections are cut from the film of polymer material;

the plurality of sections are stacked so that the magnetic circuits (37) are exactly superposed and the sections of the film of polymer material are made to adhere to one another in order to obtain a composite laminated product (40);

the sections of films made of polymer material are drilled over the entire thickness of the laminated composite product (40) in order to produce through-holes (41) in regions located within the magnetic circuits (37) and in regions located outside said magnetic circuits (37);

in that the through-holes (41) are internally metallized; and electrical conductors are produced on both sides of the composite laminated product (40), said electrical conductors joining the ends of the holes (41), in the form of at least one winding (42, 43).

21. A laminated strip comprising at least one strip obtained by the process of claim 1.

22. The process as claimed in claim 16, wherein said second combination also includes copper and silicon.

* * * * *